United States Patent
Sonoda

[19]

[11] Patent Number: 6,133,061
[45] Date of Patent: Oct. 17, 2000

[54] METHOD OF FORMING THIN ZINC OXIDE FILM, AND METHOD OF PRODUCING SEMICONDUCTOR ELEMENT SUBSTRATE AND PHOTOVOLTAIC ELEMENT USING THIN ZINC OXIDE FILM

[75] Inventor: Yuichi Sonoda, Nara, Japan

[73] Assignee: Canon Kabushiki Kaisha, Tokyo, Japan

[21] Appl. No.: 09/243,456

[22] Filed: Feb. 3, 1999

[30] Foreign Application Priority Data

Feb. 5, 1998 [JP] Japan ................................. 10-024207
Jan. 20, 1999 [JP] Japan ................................. 11-011291

[51] Int. Cl.$^7$ .................................................. H01L 21/00
[52] U.S. Cl. ............................. 438/69; 136/256; 205/123
[58] Field of Search ................................. 438/69, 71, 96, 438/97, 98; 136/256, 258, 259; 205/96, 118, 122, 123, 124, 130

[56] References Cited

U.S. PATENT DOCUMENTS 5,322,614  6/1994  May et al. .................................. 205/96
5,453,135  9/1995  Nakagawa et al. ...................... 136/259
5,804,466  6/1998  Arao et al. .................................. 438/95

OTHER PUBLICATIONS

Y. Inoue et al., "Optical Confinement Effect in a–SiGe Solar Cells on Stainless Steel Substrates", Ext. Abs. 51$^{st}$ Autumn Meeting of Japan Soc. Appl. Phys., 29 p–MF–2, p. 747 (1990).

H. Sannomiya et al., "a–SiC/a–Si/a–SiGe Multi–Bandgap Stacked Solar Cells with Bandgap Profiling", Tech. Dig. Int'l. PVSEC–5, P–IA–15, pp. 387–390 (1990).

*Primary Examiner*—Charles Bowers
*Assistant Examiner*—Keith Christianson
*Attorney, Agent, or Firm*—Fitzpatrick, Cella, Harper & Scinto

[57] ABSTRACT

The present invention provides a method of forming a thin film of zinc oxide on a conductive substrate by electrodeposition from an aqueous solution, which is capable of preventing film deposition on the back surface of the substrate. More specifically, a film deposition-preventing electrode for preventing film deposition on the back surface of the substrate is provided in an aqueous solution containing nitrate ions, and a current is supplied in such a manner that a potential relationship of "a counter electrode>the substrate>the film deposition-preventing electrode" is obtained. This method can be applied to a process for preparing a solar cell, thereby improving short circuit current density, photoelectric conversion efficiency, production yield and durability of the solar cell.

13 Claims, 5 Drawing Sheets

METHOD OF FORMING THIN ZINC OXIDE FILM, AND METHOD OF PRODUCING SEMICONDUCTOR ELEMENT SUBSTRATE AND PHOTOVOLTAIC ELEMENT USING THIN ZINC OXIDE FILM

BACKGROUND OF THE INVENTION

1. Field of the Invention

The present invention relates to a method of forming a thin film of zinc oxide and a method of producing a semiconductor element substrate and a photovoltaic element by using the thin zinc oxide film, and more particularly to a technology of forming a thin zinc oxide film in a satisfactory state on only one surface of the substrate.

2. Related Background Art

In a photovoltaic element utilizing a semiconductor layer made of a material such as hydrogenated amorphous silicon, hydrogenated amorphous silicon germanium, hydrogenated amorphous silicon carbide, microcrystalline silicon or polycrystalline silicon, there has been utilized a reflective layer on the back surface (a surface of the semiconductor layer opposite to the light incident side) in order to improve the light collecting efficiency in the long wavelength region.

Such reflective layer desirably exhibits effective reflection characteristics in a wavelength region close to the end of the band gap of the semiconductor material where the absorption becomes lower, namely in a range from 800 nm to 1200 nm. Such condition can be sufficiently satisfied by a metal layer made of a material such as gold, silver, copper or aluminum.

Also in order to achieve so-called optical confinement, it is already known to provide a layer with surface irregularities which is optically transparent within a predetermined wavelength region. Such layer with surface irregularities is generally provided between the above-mentioned metal layer and the semiconductive active layer to effectively utilize the reflected light, thereby improving the short circuit current density Jsd. Also for preventing the deterioration of the characteristics by a shunt path, it is known to provide a conductive layer of a light-transmissive material, that is, a transparent conductive layer between the metal layer and the semiconductor layer. Broadly speaking, these layers are deposited by vacuum evaporation or sputtering and provide an improvement of 1 mA/cm$^2$ or more in terms of the short circuit current density Jsd.

As examples of these configurations, the reflectivity and the textured structure of the reflection layer consisting of silver atoms are investigated in the Extended Abstract of the 51st Autumn Meeting of the Japan Society of Applied Physics (1990), 29p-MF-2, p.747 "Optical confinement effect in a-SiGe solar cell on stainless steel substrates" and Sannomiya et al., Technical Digest of the International PVSEC-5, Kyoto, Japan, p. 381, 1990, "P-IA-15 a-SiC/a-Si/a-SiGe multi-bandgap stacked solar cells with bandgap profiling". In these examples, effective irregularities are formed by depositing silver with a change in the substrate temperature to obtain a two-layered reflection layer, and an increase in the short circuit current is achieved by the optical confinement effect realized by the combination of the two-layered silver reflection layer with a zinc oxide layer provided thereon.

Such a transparent layer employed as the optical confinement layer is conventionally deposited by vacuum evaporation utilizing resistance heating, electron beam, sputtering, ion plating or chemical vapor deposition (CVD), but the drawbacks such as the high preparation cost of the target material or the like, the high depreciation cost of the vacuum apparatus and the low efficiency of material utilization result in an extremely high cost of the photovoltaic element utilizing these technologies, thereby constituting a major barrier in the industrial application of the solar cell.

As a countermeasure for such drawbacks, there has been reported the technology of forming a zinc oxide film by liquid phase deposition (Preprint of the 65th technical seminar of the Japanese Academy of Applied Physics (Fall 1995), p. 410 "Formation of ZnO film by electrolysis in aqueous solution").

This method which does not require an expensive vacuum apparatus or an expensive target can drastically reduce the manufacturing cost of the zinc oxide film. Also this method is effective for the photovoltaic element of a large area such as solar cells, because film deposition can be made also on a substrate with a large area. However, this electrochemical method of depositing zinc oxide has the following drawbacks:

(1) Since zinc oxide is deposited electrolytically on a conductive substrate, the zinc oxide film is deposited also on the back surface of the substrate, thereby causing deterioration of the work efficiency such as deterioration of the soldering property or of the adhesion property of an adhesive material on the back surface. Also when the substrate on which the zinc oxide film is formed by electrodeposition is supplied to the production process for a photovoltaic element, the solar cell characteristics may be deteriorated by degassing in the vacuum apparatus. Furthermore, transport failure may result in the post process of the roll-to-roll system due to fluctuation in the friction coefficient.

(2) A deposited film tends to generate abnormal growth of acicular, spherical or ramified shapes on the order of microns or more on the film, particularly when the current density or the concentration of the solution is elevated. When the zinc oxide film is employed as a part of the photovoltaic element, such abnormal growth may induce a shunt path in the photovoltaic element.

SUMMARY OF THE INVENTION

In consideration of the foregoing, an object of the present invention is to establish a mass production technology of carrying out electrodeposition of a thin zinc oxide film at a low cost and provide a method of forming a semiconductor element substrate having high performance and satisfactory adhesion of the zinc oxide film to the substrate with less film deposition on the back surface of the substrate and stably supplying the semiconductor element substrate at a low cost and to contribute to the spread of solar power generation by employing such element substrate in photovoltaic elements.

The present invention provides a method of forming a thin film of zinc oxide on a conductive substrate by supplying a current between the conductive substrate immersed in one or more aqueous solutions containing at least zinc ions and a counter electrode immersed in at least one of the aqueous solutions, which comprises immersing one or more film deposition-preventing electrodes for preventing film deposition on a back surface of the substrate in at least one of the aqueous solutions and supplying a current in such a manner that potentials of the rear film deposition preventing electrode, the conductive substrate and the counter electrode satisfy a relationship of "the counter electrode>the conductive substrate>the film deposition-preventing electrode" or "the counter electrode<the conductive substrate<the film deposition-preventing electrode".

The above-mentioned method of thin zinc oxide film formation of the present invention allows for the formation of a thin film of zinc oxide while preventing film deposition on the back surface by absorbing zinc oxide moving to the back side of the conductive substrate and etching zinc oxide deposited on the back surface. It is thus rendered possible to prevent film deposition on the back surface of the conductive substrate and to improve soldering ability and adhesion of an adhesive material, thereby improving the work efficiency in the post process.

Also the application of the present method to the production of a photovoltaic element enables the efficient production of a high performance element substrate without deterioration of the solar cell characteristics due to degassing or impurity contamination in the vacuum apparatus. Also there can be achieved easy control of transportation in production of the photovoltaic element by continuously carrying film formation using a roll-to-roll system.

In the above-mentioned thin zinc oxide film forming method of the present invention, it is preferable that the absolute value of the applied current (flowing current) between the conductive substrate and the film deposition-preventing electrode is within a range from 0.1% to 100% of the applied current between the counter electrode and the conductive substrate. It is thus possible to effectively prevent deposition of the film on the back surface of the substrate and to obtain the thin zinc oxide film without unevenness of film thickness.

Also the aforementioned aqueous solution containing zinc ions preferably also contain nitrate ions and further saccharose or dextrin. It is possible to drastically suppress abnormal growth in the zinc oxide layer and to easily achieve film formation at a high concentration, thereby obtaining a thin zinc oxide film of a textured structure suitable for use as an optical confinement layer. It is furthermore possible to improve the production yield of the photovoltaic element and to stably and continuously supply the photovoltaic element of excellent adhesion characteristics and performance (improved short circuit current and conversion efficiency).

It is also preferable to employ, as the above-mentioned conductive substrate, a conductive substrate on which a thin zinc oxide film is formed in advance. An electrochemical method of forming a zinc oxide film on the thin zinc oxide film deposited in advance allows for the relatively easy formation of a thin zinc oxide film with less abnormal growth, in an efficient and uniform manner. The method of forming the zinc oxide film in advance is preferably achieved by sputtering or vacuum evaporation.

In the case of continuously forming the thin zinc oxide film while transporting the substrate by using the roll-to-roll system, the film deposition-preventing electrode for preventing film deposition on the back surface of the substrate is preferably provided so as to oppose the rear portion (conductive substrate wind-up side) of the counter electrode and/or to be positioned closer to a conductive substrate wind-up side than the counter electrode. It is thus possible to minimize the area of the electrode, thereby improving work efficiency and maintaining film uniformity.

In the case of forming the thin zinc oxide film while transporting the substrate using the roll-to-roll system or the like, the film deposition-preventing electrode is preferably present in the same aqueous solution (zinc oxide layer forming bath) as that in which the counter electrode is present. It is thus possible to prevent drying of the thin zinc oxide film deposited on the back surface and becoming unpeelable or peeling off and sticking onto transporting rollers.

Also the area of the film deposition-preventing electrode (area of the surface opposed to the conductive substrate) preferably does not exceed 50% of the area of the conductive substrate present in the zinc oxide film forming bath, and more preferably does not exceed 20%, whereby the uniformity of the film can be maintained. Furthermore, the width of the film deposition-preventing electrode preferably does not exceed 120% of the width of the conductive substrate, whereby the uniformity of the film can be maintained. Also, on the film deposition-preventing electrode, growth of tubular zinc oxide of a diameter of 0.1 mm to 3.0 mm (dendrite growth) is observed. The distance between the film deposition-preventing electrode and the substrate is preferably 10 mm or more in order to prevent damage in the substrate which is generated from contact between the grown layer and the substrate, and preferably does not exceed 1000 mm in order to maintain film uniformity. Also, since the dendrite growth tends to appear in the front portion (conductive substrate feeding side) of the film deposition-preventing electrode, the length of the preventing electrode preferably does not exceed 100% of the width of the conductive substrate present in the zinc oxide film forming bath. The film deposition-preventing electrode may be provided in plurality, if necessary. As long as particularly mentioned herein, the direction of "length" is a transport direction of the substrate, and the direction of "width" is a direction perpendicular to the transport direction of the substrate.

Also the thin zinc oxide film forming method of the present invention may be applied to the production of a semiconductor element substrate or a photovoltaic element, thereby enabling the roll-to-roll continuous production of the photovoltaic element having high performance (excellent short circuit current, conversion efficiency and adhesion) at a low electric power cost. In particular, the production cost of the thin zinc oxide film can be reduced to about $1/100$ in comparison with that of the sputtering method.

DETAILED DESCRIPTION OF THE PREFERRED EMBODIMENTS

Figure 1:
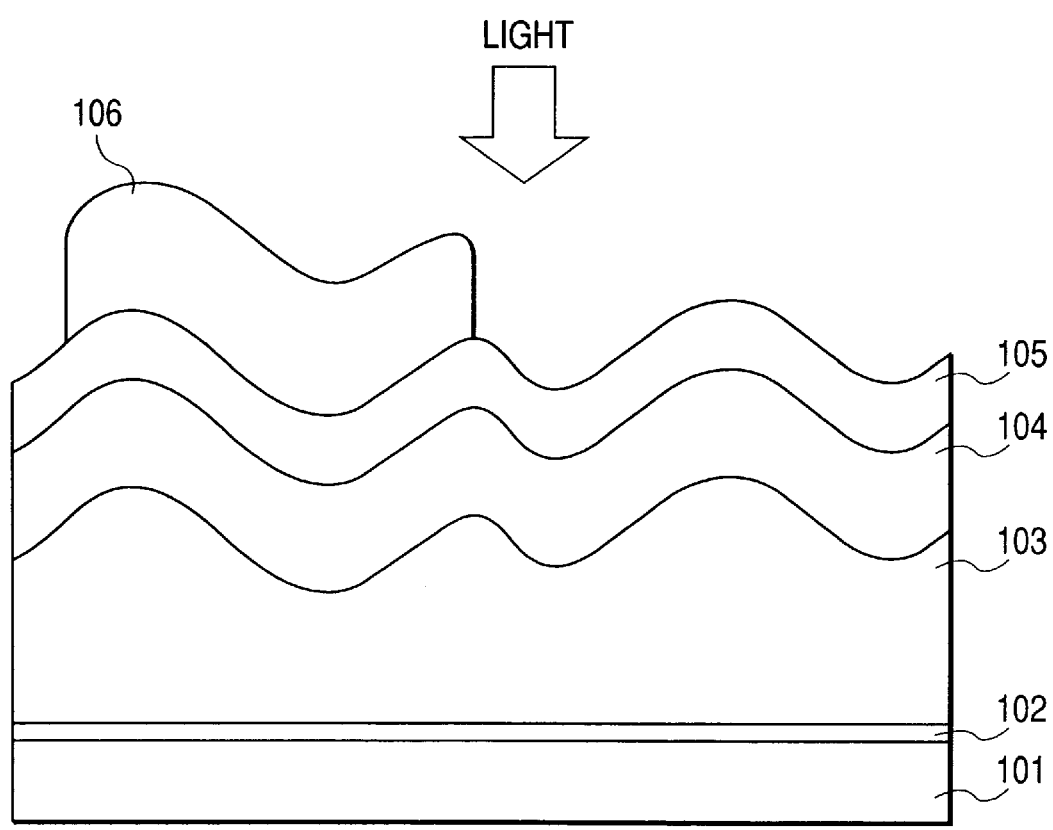
FIG. 1 is a schematic sectional view showing an example of a photovoltaic element to which the thin zinc oxide film forming method of the present invention can be advantageously applied.

FIG. 1 is a schematic sectional view showing an example of a photovoltaic element to which the thin zinc oxide film forming method of the present invention can be advantageously applied. In FIG. 1, numeral 101 indicates a support member (substrate), 102 a metal layer, 103 a zinc oxide layer consisting of hexagonal polycrystals, 104 a semiconductor film, 105 a transparent conductive layer, and 106 a current collecting electrode. The support member (substrate) 101 and the metal layer 102 constitute the conductive substrate (light-reflecting metal substrate) of the present invention. In the case of a configuration receiving light from the side of the transparent substrate, the constituent layers are formed in the inverted order except for the substrate.

In the following, there will be explained the constituents of the above-described photovoltaic element and the producing method thereof.

Support member (substrate)

The support member (substrate) 101 can be composed of a resin, glass or ceramic material coated with a metal layer or a conductive material and may be provided with fine irregularities on the surface. Also a transparent substrate may be employed as the support member for realizing a configuration receiving light from the side of such substrate.

A long substrate may also be employed for enabling continuous film formation. In particular, a material such as stainless steel or polyimide is advantageous because of flexibility.

Metal layer

The metal layer 102 functions as an electrode and also as a reflective layer for reflecting light reaching the substrate 101 and causing the light to be re-utilized in the semiconductor layer 104. The metal layer 102 is obtained by forming a film of Al, Cu, Ag, Au or the like formed by evaporation, sputtering, electrodeposition, printing or the like.

By providing irregularities on the surface of the metal layer, it is possible to extend the optical path length of the reflected light in the semiconductor layer 104, thereby increasing the short circuit current. The metal layer may be omitted when the substrate 101 is conductive. In such case, the substrate 101 constitutes the conductive substrate of the present invention.

Zinc oxide layer

The zinc oxide layer (transparent conductive layer) 103 functions to increase the random reflection of the incident and reflected light, thereby increasing the optical path length in the semiconductor layer 104. It also functions to prevent shunting of the photovoltaic element which is caused from diffusion or migration of the atoms or ions of the metal layer 102 into the semiconductor layer 104. Furthermore, a suitable resistance may be given to the zinc oxide layer 103 to prevent short circuit due to a defect such as a pinhole in the semiconductor layer 104. The zinc oxide layer 103 preferably has irregularity on the surface, similarly to the metal layer 102.

In the present invention, the zinc oxide layer 103 is formed by electrodeposition which is explained in the following and which is advantageous in terms of apparatus and material cost.

Method of Forming Zinc Oxide Layer by Electrodeposition

Figure 2:
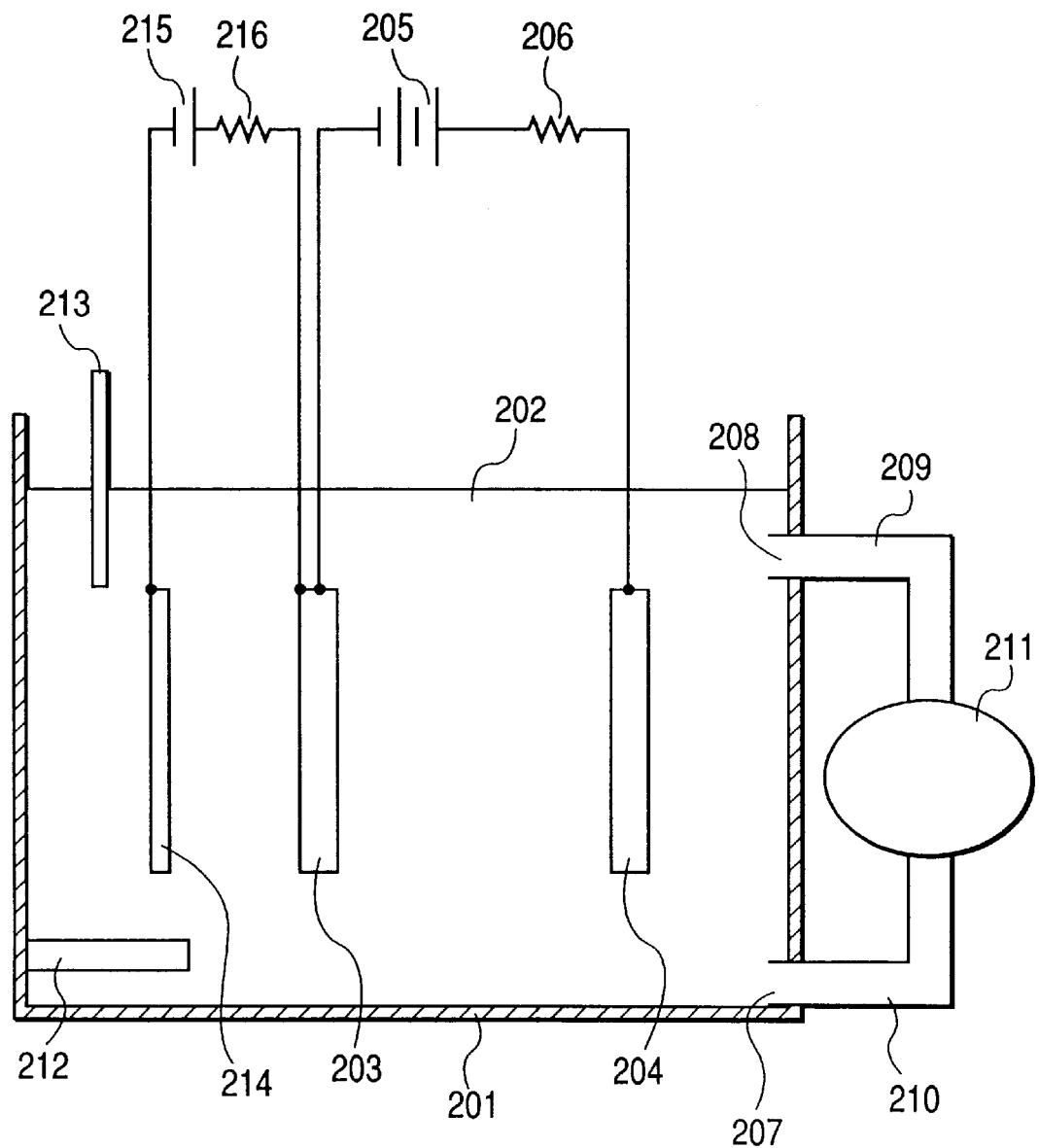
FIG. 2 is a schematic view showing an apparatus for forming a thin zinc oxide film which is employed in one example of the present invention.

The zinc oxide layer can be formed, for example, with a thin zinc oxide film forming apparatus shown in FIG. 2, wherein an anticorrosive container 201 has an aqueous solution containing zinc ions therein as the aqueous solution 202 for electrodeposition. The concentration of zinc ions is preferably within a range of 0.002 to 3.0 mol/liter, more preferably 0.01 to 1.5 mol/liter, and most preferably 0.05 to 0.7 mol/liter.

In the present invention, the aqueous solution 202 preferably contains nitrate ions, zinc ions and saccharose or dextrin. In such a case, the concentration of nitrate ions is preferably within a range of 0.004 to 6.0 mol/liter, more preferably 0.01 to 1.5 mol/liter, and most preferably 0.1 to 1.4 mol/liter. Also the concentration of saccharose is preferably within a range of 1 to 500 g/liter, and more preferably 3 to 100 g/liter, and the concentration of dextrin is preferably within a range of 0.01 to 10 g/liter, and more preferably 0.025 to 1 g/liter. In this manner, there can be efficiently formed a thin zinc oxide film with a textured structure suitable for an optical confinement layer.

The conductive substrate 203 and a zinc plate (counter electrode) 204 are electrodes, and film formation can be carried out by electrodeposition using both electrodes. The film formation in the present case is conducted on the conductive substrate 203. The conductive substrate 203 and the zinc plate 204 are connected to a power source 205 through a load resistor 206 in order to obtain a substantially constant current. The counter electrode may be provided in plurality, if necessary. The current is preferably within a range of 0.1 to 100 mA/cm$^2$, more preferably 1 to 30 mA/cm$^2$, and most preferably 3 to 15 mA/cm$^2$.

In FIG. 2, numeral 214 indicates a film deposition-preventing electrode for preventing film deposition on the back surface of the conductive substrate which is maintained at a negative potential with respect to the conductive substrate 203 by means of a load resistor 215 and a power source 216. A current supplied between the film deposition-preventing electrode 214 and the conductive substrate 203 is preferably within a range of −0.01 to −80 mA/cm$^2$, more preferably −0.1 to −15 mA/cm$^2$, and most preferably −1 to −10 mA/cm$^2$. Effective prevention of the film deposition on the back surface is made possible by maintaining a distance between the conductive substrate 203 and the film deposition preventing electrode 214 at 50 cm or less, preferably 10 cm or less. The film deposition-preventing electrode 214 is preferably composed of a conductive material such as stainless steel, Zn, Ti or Pt.

In FIG. 2, there are also shown a heater 212 and a thermometer 213. The solution is maintained at a temperature of 50° C. or more to achieve effective formation of a uniform thin zinc oxide film with less abnormal growth. For agitating the entire solution, there is employed a solution circulating system consisting of a solution inlet 208, a solution outlet 207, a solution circulating pump 211, a solution receiving pipe 209 and a solution emitting pipe 210. In a smaller-sized apparatus, the solution circulating system may be replaced by a magnetic stirrer.

Semiconductor layer

The semiconductor layer 104 is advantageously composed of amorphous or microcrystalline Si, C, Ga or an alloy thereof. The semiconductor layer 104 preferably contains hydrogen and/or halogen atoms at the same time. A preferred content thereof is within a range of 0.1 to 40 atomic %. The semiconductor layer 104 may further contain impurities such as oxygen, nitrogen, etc. The concentration of such impurities is desirably 5×10$^{19}$ cm$^{-3}$. The semiconductor layer 104 preferably further contains an element of Group III of the periodic table for forming a p-type semiconductor or an element of Group V of the periodic table for forming an n-type semiconductor.

In the case of a stacked type solar cell in which the semiconductor layer 104 has a plurality of pin junctions, it is preferable that the i-type semiconductor layer of the pin junction close to the light incident side has a wider band gap, and the band gap of the i-type semiconductor becomes narrower as the pin junction becomes farther from the light incident side. Also in the i-type layer, the band gap is preferably smaller at a portion of the i-type layer closer to the p-type layer than at the center of the i-type layer.

The doped layer (p-type or n-type layer) at the light incident side is advantageously composed of a crystalline semiconductor with low light absorption or a semiconductor with a wide band gap.

The semiconductor layer 104 can be advantageously formed by microwave (MW) plasma CVD, VHF plasma CVD or RF plasma CVD.

In depositing such a semiconductor film, the i-type layer may be formed, for example, by a technology of employing graded SiGe to obtain a Ge composition of 20 to 70 atomic %, as disclosed in the Japanese Patent Laid-Open Application No. 4-119843.

Transparent conductive layer

The transparent conductive layer 105 may be given a suitable thickness to also function as a reflection preventing film. The transparent conductive layer 105 is formed by evaporation, CVD, spraying, spin coating or immersion coating of a material such as ITO (indium tin oxide), ZnO or $InO_3$. These compounds may also contain a substance for modifying conductivity.

Current collecting electrode

The current collecting electrode 106 is provided for improving the current collecting efficiency. It can be formed, for example, by a method of forming a metallic current-collecting pattern by sputtering with a mask, a method of printing a conductive paste or solder paste, or a method of adhering a metal wire with a conductive paste.

If necessary, a protective film may be formed on both sides of the photovoltaic element. Also there may be employed a reinforcing material such as a steel plate.

EXAMPLE 1

In this example, the apparatus shown in FIG. 2 was employed for forming a thin zinc oxide film. The conductive substrate (negative electrode) 203 was composed of a plate of stainless steel 430BA having a thickness of 0.12 mm, a width of 50 mm and a length of 50 mm, sputtered with copper in a thickness of 2000 Å, and the zinc plate (positive electrode) 204 was composed of a 4-N zinc plate (99.99%) having a thickness of 1 mm, a width of 50 mm and a length of 50 mm. The film deposition preventing electrode 214 was composed of a plate of stainless steel 304 having a thickness of 1.0 mm, a width of 50 mm and a length of 50 mm. The distance between the substrate 203 and the electrode 214 was 20 mm. The aqueous solution 202 was composed of an aqueous solution of zinc nitrate having a concentration of 0.15 mol/liter at a temperature of 80° C. The electrodeposition was conducted by grounding the negative electrode 203, supplying a current of 3.0 mA/cm² (0.3 A/dm²: 75 mA) between the positive electrode 204 and the negative electrode 203 and also supplying a current of −0.1 mA/cm² (−0.01 A/dm²: −2.5 mA), −0.5 mA/cm² (−0.05 A/dm²: −12.5 mA), −1.0 mA/cm² (−0.1 A/dm²: −25 mA) or −3.0 mA/cm² (−0.3 A/dm²: −75 mA) between the negative electrode 203 and the film deposition-preventing electrode 214 so as to maintain the film deposition-preventing electrode 214 at a more negative potential.

The thin zinc oxide film obtained on the negative electrode 203 was subjected to the measurement of thickness by optical interferometry based on the wave form of an optical interferometer (V-570 manufactured by Nippon Bunko Co.), and the state of film deposition on the back surface of the conductive substrate (turn of deposition to the back surface) on the negative electrode 203 was confirmed by visual observation. The obtained results are shown in Table 1.

EXAMPLE 2

The electrodeposition was conducted in the same manner as in Example 1, except for employing an aqueous solution of zinc nitrate having a concentration of 0.15 mol/liter and a temperature of 80° C., grounding the negative electrode 203, supplying a current of 1.0 mA/cm² (0.1 A/dm²: 75 mA) between the positive electrode 204 and the negative electrode 203 and also supplying a current of −0.1 mA/cm² (−0.01 A/dm²: −2.5 mA), −0.5 mA/cm² (−0.05 A/dm²: −12.5 mA), −1.0 mA/cm² (−0.1 A/dm²: −25 mA) or −3.0 mA/cm² (−0.3 A/dm²: −75 mA) between the negative electrode 203 and the film deposition-preventing electrode 214 so as to maintain the film deposition-preventing electrode 214 at a more negative potential.

The thin zinc oxide film obtained on the negative electrode 203 was subjected to the measurement of thickness by optical interferometry based on the wave form of an optical interferometer (V-570 manufactured by Nippon Bunko Co.), and the state of film deposition on the back surface of the conductive substrate (turn of deposition to the back surface) on the negative electrode 203 was confirmed by visual observation. The obtained results are shown in Table 1.

EXAMPLE 3

Figure 3:
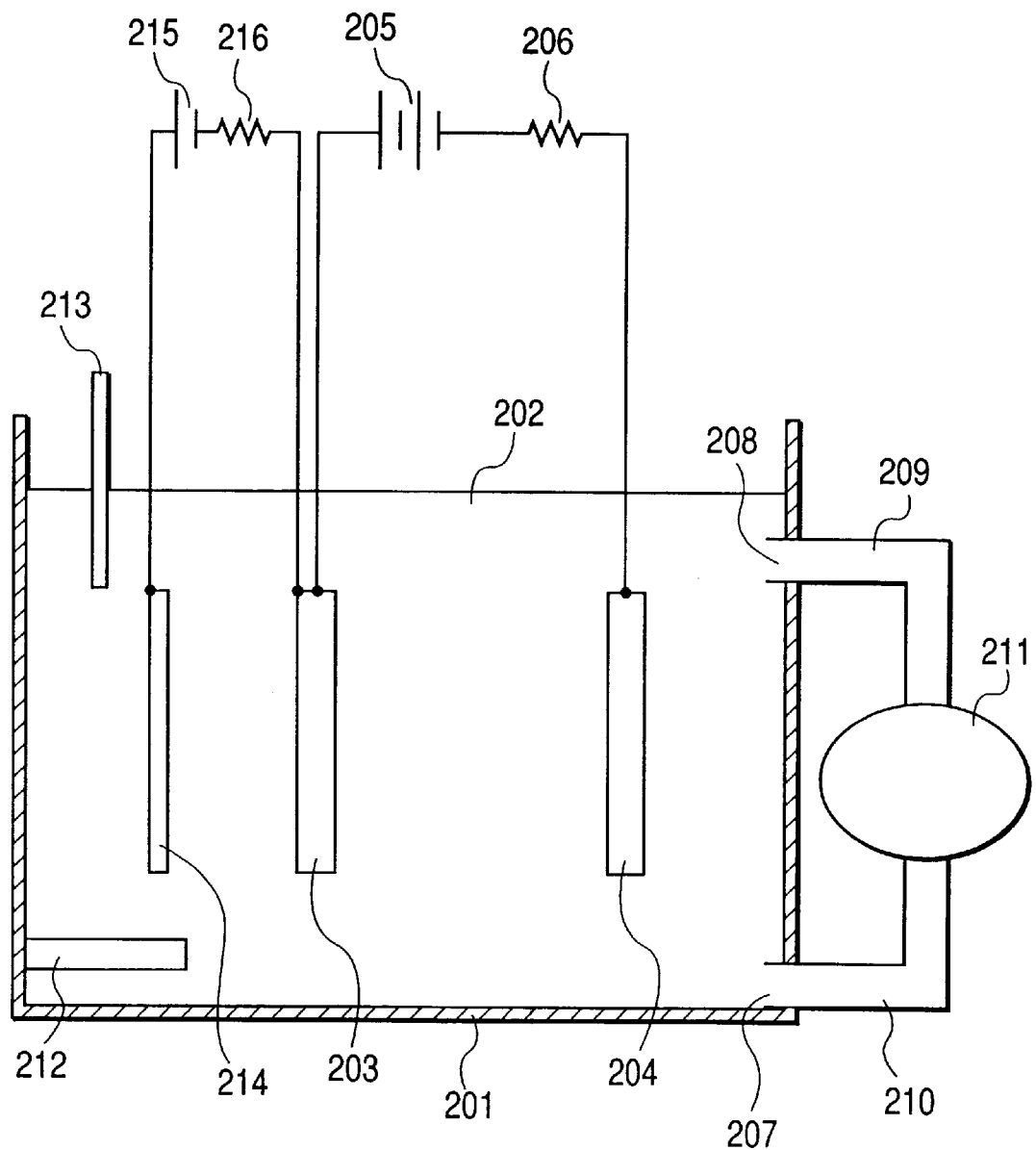
FIGS. 3, 4 and 5 are schematic views showing apparatuses for forming a thin zinc oxide film which are employed in other examples of the present invention.

In this example, the apparatus shown in FIG. 3 was employed for forming a thin zinc oxide film. The apparatus shown in FIG. 3 is similar to that shown in FIG. 2, except for using the different polarity of the power source. The conductive substrate (positive electrode) 203 was composed of a plate of stainless steel 430BA having a thickness of 0.12 mm, a width of 50 mm and a length of 50 mm, sputtered with copper in a thickness of 2000 Å, and the zinc plate (negative electrode) 204 was composed of a 4-N zinc plate having a thickness of 1 mm, a width of 50 mm and a length of 50 mm. The film deposition-preventing electrode 214 was composed of a plate of stainless steel 304 having a thickness of 1.0 mm, a width of 50 mm and a length of 50 mm. The distance between the substrate 203 and the electrode 214 was 20 mm. The aqueous solution 202 was composed of an aqueous solution of ammonia having a concentration of 0.2 mol/liter added with zinc oxide at a concentration of 0.05 mol/liter and maintained at a temperature of 80° C. The electrodeposition was conducted by grounding the positive electrode 203, supplying a current of −3.0 mA/cm² (−0.3 A/dm²: −75 mA) between the positive electrode 203 and the negative electrode 204 and also supplying a current of 0.1 mA/cm² (0.01 A/dm²: 2.5 mA), 0.5 mA/cm² (0.05 A/dm²: 12.5 mA), 1.0 mA/cm² (0.1 A/dm²: 25 mA) or 3.0 mA/cm² (0.3 A/dm²: 75 mA) between the positive electrode 203 and the rear film deposition-preventing electrode 214 so as to maintain the film deposition-preventing electrode 214 at a more positive potential.

The thin zinc oxide film obtained on the positive electrode 203 was subjected to the measurement of thickness by optical interferometry based on the wave form of an optical interferometer (V-570 manufactured by Nippon Bunko Co.), and the state of film deposition on the back surface of the conductive substrate (turn of deposition to the back surface) on the positive electrode 203 was confirmed by visual observation. The obtained results are shown in Table 1.

Comparative Example 1

The electrodeposition was conducted in the same manner as in Example 1, except that the film deposition-preventing electrode 214 was not employed.

The thin zinc oxide film obtained on the negative electrode 203 was subjected to the measurement of thickness by optical interferometry based on the wave form of an optical interferometer (V-570 manufactured by Nippon Bunko Co.), and the state of film deposition on the back of the conductive substrate (turn of deposition to the back surface) on the negative electrode 203 was confirmed by visual observation. The obtained results are shown in Table 1. The following conclusions can be deduced from the results shown in Table 1.

The film deposition on the back surface of the conductive substrate can be prevented by providing the film deposition-preventing electrode 214 and supplying a current in such a manner that the potentials of the film deposition-preventing electrode, the conductive substrate and the counter electrode satisfy the relationship "the counter electrode>the conductive substrate>the film deposition preventing electrode" or "the counter electrode<the conductive substrate<the film deposition-preventing electrode". Also effective prevention of film deposition on the back with a small uneven thickness of the deposited film can be achieved by maintaining the absolute value of the current applied between the conductive substrate and the film deposition-preventing electrode smaller than that of the current applied between the counter electrode and the conductive substrate.

EXAMPLE 4

In this example, the apparatus shown in FIG. 2 was employed for forming a thin zinc oxide film. The negative electrode 203 was composed of a plate of stainless steel 430BA having a thickness of 0.12 mm, a width of 50 mm and a length of 50 mm, sputtered with copper in a thickness of 2000 Å, and the positive electrode 204 was composed of a 4-N zinc plate having a thickness of 1 mm, having a width of 50 mm and a length of 50 mm. The film deposition-preventing electrode 214 was composed of a plate of stainless steel 304 having a thickness of 1.0 mm, a width of 40 mm and a length of 40 mm. The distance between the substrate 203 and the electrode 214 was 30 mm. The aqueous solution 202 was composed of an aqueous solution of zinc nitrate having a concentration of 0.2 mol/liter at a temperature of 85° C. The electrodeposition was conducted by grounding the negative electrode 203, supplying a current of 3.0 mA/cm$^2$ (0.3 A/dm$^2$: 75 mA) between the positive electrode 204 and the negative electrode 203 and also supplying a current of −0.1 mA/cm$^2$ (−0.01 A/dm$^2$) between the negative electrode 203 and the film deposition-preventing electrode 214 so as to maintain the film deposition-preventing electrode 214 at a more negative potential.

The thin zinc oxide film obtained on the negative electrode 203 was subjected to the measurement of the number of abnormal growths by visual observation (in an area of 3 cm×3 cm). Also the number of abnormal growths was counted in an area of 10 mm×10 mm under an SEM (Hitachi S-4500). Also a bending-peeling test was conducted on samples prepared for each substrate. The obtained results are shown in Table 2.

EXAMPLE 5

The electrodeposition was conducted in the same manner as in Example 4, except for employing an aqueous solution of zinc nitrate having a concentration of 0.2 mol/liter added with sucrose at a concentration of 12 g/liter and maintained at a temperature of 85° C.

The thin zinc oxide film obtained on the negative electrode 203 was subjected to the measurement of the number of abnormal growths by visual observation (in an area of 3 cm×3 cm). Also the number of abnormal growths was counted in an area of 10 mm×10 mm, under a SEM (Hitachi S-4500). Also a bending-peeling test was conducted on samples prepared for each substrate. The obtained results are shown in Table 2.

EXAMPLE 6

The electrodeposition was conducted in the same manner as in Example 4, except for employing an aqueous solution of zinc nitrate having a concentration of 0.2 mol/liter added with dextrin at a concentration of 0.1 g/liter and maintained at a temperature of 85° C.

The thin zinc oxide film obtained on the negative electrode 203 was subjected to the measurement of the number of abnormal growths by visual observation (in an area of 3 cm×3 cm). Also the number of abnormal growths was counted in an area of 10 mm×10 mm under an SEM (Hitachi S-4500). Also a bending-peeling test was conducted on samples prepared for each substrate. The obtained results are shown in Table 2.

EXAMPLE 7

The electrodeposition was conducted in the same manner as in Example 4, except for employing, as the negative electrode 203, a plate of stainless steel 430BA having a thickness of 0.12 mm, a width of 50 mm and a length of 50 mm sputtered with copper in a thickness of 2000 Å and further with ZnO in a thickness of 1000 Å.

The thin zinc oxide film obtained on the negative electrode 203 was subjected to the measurement of the number of abnormal growths by visual observation (in an area of 3 cm×3 cm). Also the number of abnormal growths was counted in an area of 10 mm×10 mm under an SEM (Hitachi S-4500). Also a bending-peeling test was conducted on samples prepared for each substrate. The obtained results are shown in Table 2. The following conclusions can be obtained from the results shown in Table 2.

Addition of saccharose or dextrin makes it possible to obtain a thin zinc oxide film having significantly reduced abnormal growth and improved adhesion. Also the use of ZnO as an underlying layer allows for the formation of a thin zinc oxide film having further improved adhesion.

EXAMPLE 8

In this example, the apparatus shown in FIG. 2 was first employed for forming a thin zinc oxide film. The negative electrode 203 was composed of a plate of stainless steel 430BA having a thickness of 0.12 mm, a width of 50 mm and a length of 50 mm sputtered with copper in a thickness of 2000 Å, and the positive electrode 204 was composed of a 4-N zinc plate having a thickness of 1 mm, a width of 50 mm and a length of 50 mm. The film deposition-preventing electrode 214 was composed of a plate of stainless steel 304 having a thickness of 1.0 mm, a width of 40 mm and a length of 40 mm. The distance between the substrate 203 and the electrode 204 was 30 mm. The aqueous solution 202 was composed of an aqueous solution of zinc nitrate having a concentration of 0.2 mol/liter added with dextrin at a concentration of 0.1 g/liter and maintained at a temperature of 80° C. The electrodeposition was conducted by grounding the negative electrode 203, supplying a current of 4.0 mA/cm$^2$ (0.4 A/dm$^2$: 100 mA) between the positive electrode 204 and the negative electrode 203 and also supplying a current of −0.8 mA/cm$^2$ (−0.08 A/dm$^2$: −12.8 mA) between the negative electrode 203 and the film deposition-preventing electrode 214 so as to maintain the film deposition-preventing electrode 214 at a more negative potential.

On the substrate having the thin zinc oxide film thus formed thereon, n-type amorphous silicon (a-Si) of a thickness of 200 Å, non-doped i-type amorphous silicon (a-Si) of a thickness of 2000 Å and p-type microcrystalline silicon (μc-Si) of a thickness of 140 Å were deposited in this order as the semiconductor layer by CVD. Then, ITO was evaporated with a thickness of 650 Å by heating in an oxygen atmosphere to form a transparent conductive layer, as an upper electrode with antireflection effect. A photovoltaic element was completed by depositing thereon a grid consisting of silver by heat-evaporation to form an upper output electrode (collecting electrode).

The obtained element was subjected to the measurement of a short circuit current density and a photoelectric conversion efficiency using a solar simulator (AM1.5, 100 mW/cm$^2$, surface temperature of 25° C.). Also the element was subjected to the measurement of deterioration rate of the photoelectric conversion efficiency by an HH test (standing for 1000 hours under a temperature of 85° C. and a relative humidity of 85%) as an acceleration test. The obtained results are shown in Table 3.

Comparative Example 2

The photovoltaic element was produced in the same manner as in Example 8, except that the thin zinc oxide film was formed without the film deposition-preventing electrode 214 for preventing film deposition on the back of the conductive substrate.

The obtained element was subjected to the measurement of a short circuit current density and a photoelectric conversion efficiency using a solar simulator (AM1.5, 100 mW/cm$^2$, surface temperature of 25° C.). Also the element was subjected to the measurement of deterioration rate of the photoelectric conversion efficiency by an HH test (standing for 1000 hours under a temperature of 85° C. and a relative humidity of 85%) as an acceleration test. The obtained results are shown in Table 3.

EXAMPLE 9

The photovoltaic element was produced in the same manner as in Example 8, except for employing, as the negative electrode 203, a plate of stainless steel 430BA having a thickness of 0.12 mm, a width of 50 mm and a length of 50 mm sputtered with copper in a thickness of 2000 Å and further with ZnO in a thickness of 1000 Å.

The obtained element was subjected to the measurement of short circuit current density and photoelectric conversion efficiency using a solar simulator (AM1.5, 100 mW/cm$^2$, surface temperature of 25° C.). Also the element was subjected to the measurement of deterioration rate of the photoelectric conversion efficiency by an HH test (standing for 1000 hours under a temperature of 85° C. and a relative humidity of 85%) as an acceleration test. The obtained results are shown in Table 4.

Comparative Example 3

The photovoltaic element was produced in the same manner as in Example 8, except that the thin zinc oxide film was formed without employing the film deposition-preventing electrode 214.

The obtained element was subjected to the measurement of short circuit current density and photoelectric conversion efficiency using a solar simulator (AM1.5, 100 mW/cm$^2$, surface temperature of 25° C.). Also the element was subjected to the measurement of deterioration rate of the photoelectric conversion efficiency by an HH test (standing for 1000 hours under a temperature of 85° C. and a relative humidity of 85%) as an acceleration test. The obtained results are shown in Table 4.

The following conclusions can be obtained from the results shown in Tables 3 and 4. The use of the substrate on which the thin zinc oxide film is formed in a system utilizing the film deposition-preventing electrode makes it possible to obtain a photovoltaic element having an excellent short circuiting current density, an excellent photoelectric conversion efficiency and a reduced deterioration rate of the photoelectric conversion efficiency.

EXAMPLE 10

Figure 4:
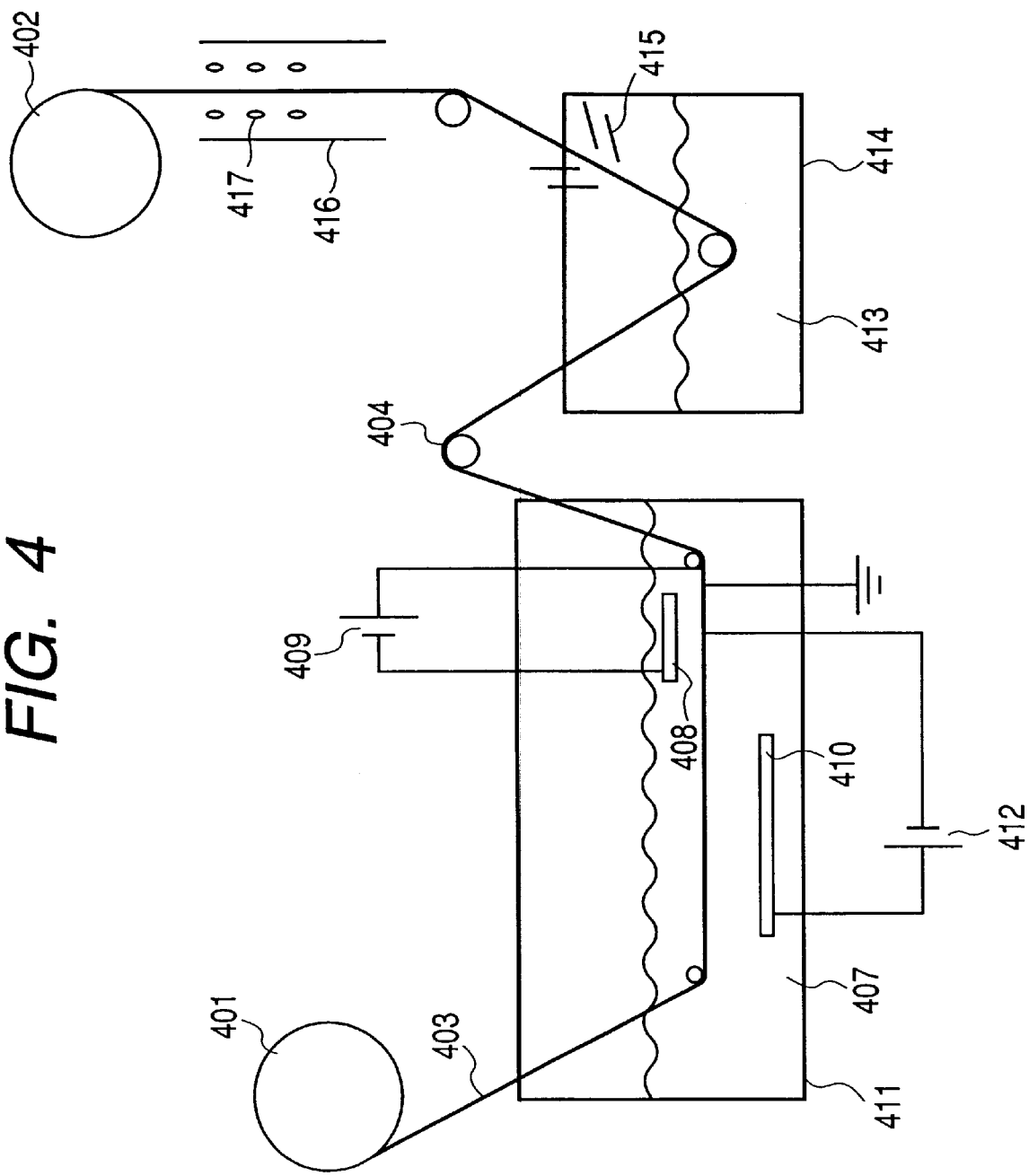

A thin zinc oxide film was formed, by using the roll-to-roll apparatus shown in FIG. 4, on a long substrate 403 fed from a feeding roller 401 having the rolled substrate, which was prepared by depositing, on a long plate of stainless steel 430BA, a metal layer consisting of aluminum of a thickness of 2000 Å by a roll-to-roll DC magnetron sputtering apparatus, and thereon a thin zinc oxide film of a thickness of 1000 Å by a similar roll-to-roll DC magnetron sputtering apparatus.

The long substrate 403 was fed from a feeding roller 401, then passed through a zinc oxide film forming tank 411 and a water rinsing tank 414 and wound up on a wind-up roller 402. The zinc oxide film forming bath 407 contained 70 g of zinc nitrate hexahydrate and 0.5 g of dextrin in 1 liter of water, and a solution circulating system was employed for agitating the solution. The bath 407 was maintained at a temperature of 85° C. and a pH value of 4.0 to 6.0. In the bath 407, there were provided a zinc plate with buff-polished surface having a width of 120 mm and a length of 1500 mm as the counter electrode 410, and a film deposition preventing electrode 408 for preventing film deposition on the back of the substrate (a stainless steel 304 plate, a width of 130 mm and a length of 50 mm). The electrodeposition was conducted by grounding the substrate 403 (a width of 120 mm and a length of 3000 mm in the bath) constituting the negative electrode, supplying a current of 5.0 mA/cm$^2$ (0.5 A/dm$^2$: 9000 mA) between the counter electrode 410 constituting the positive electrode and the negative electrode 403 and also supplying a current of –0.8 mA/cm$^2$ (–0.08 A/dm$^2$: –52 mA) between the substrate (negative electrode) 403 and the film deposition-preventing electrode 408 so as to maintain the film deposition-preventing electrode 408 at a more negative potential. The distance between the electrodes 403 and 408 was 20 mm. In this operation, the film deposition-preventing electrode 408 is positioned behind the counter electrode 410 (closer to the wind-up roller side) in order to minimize the electrode area and to improve the work efficiency. In FIG. 4, there are also shown power sources 409 and 412, a rinsing bath 413, a rinsing shower 415, a drying oven 416 and an infrared heater 417.

The film forming rate was 30 Å/sec, and a thin zinc oxide film of a thickness of 2 μm was formed on a surface of the substrate facing the counter electrode without deposition of a zinc oxide film on the back surface (surface facing to the film deposition-preventing electrode) of the substrate 403.

On the substrate 403 subjected to the formation of the thin zinc oxide film as explained in the foregoing, a semiconductor layer having a three-layered structure was formed using a roll-to-roll CVD apparatus. At first, an n-type semiconductor layer was formed by employing a gaseous mixture of silane, phosphine and hydrogen, heating the aluminum layer and the zinc oxide layer formed on the substrate 403 to a temperature of 340° C. and supplying an RF power of 400 W. Then, an i-type semiconductor layer was formed by employing a gaseous mixture of silane, germane and hydrogen, heating the substrate at 450° C. and supplying a microwave power, and a p-type semiconductor layer was formed by heating the substrate at 250° C. and employing a gaseous mixture of boron trifluoride, silane and hydrogen, thereby obtaining a bottom pin layer. Subsequently, a middle pin layer was similarly formed by increasing the mixing ratio of silane and germane in the i-type semiconductor layer, and a top pin layer was formed by depositing the i-type semiconductor layer with silane and hydrogen. Then, ITO was deposited as the transparent conductive layer in a roll-to-roll sputtering apparatus. Thereafter, a current collecting electrode was formed with a silver paste to obtain a photovoltaic element of a configuration shown in FIG. 1.

The obtained element was subjected to the measurement of a short circuit current density and a photoelectric conversion efficiency using a solar simulator (AM1.5, 100 mW/cm$^2$, surface temperature of 25° C.). Also the element was subjected to the measurement of deterioration rate of the photoelectric conversion efficiency by an HH test (standing for 1000 hours under a temperature of 85° C. and a relative humidity of 85%) as an acceleration test.

In the semiconductor forming apparatus and the transparent electrode forming apparatus of roll-to-roll type, no failure in transportation (emergency stop caused by an aberration of the edge of the substrate by ±3 mm from a standard value) was observed in the course of formation of a 100 m long film. The obtained results are shown in Tables 5 and 6.

Comparative Example 4

The photovoltaic element was produced in the same manner as in Example 9, except that the thin zinc oxide film was formed on the substrate 403 without employing the film deposition-preventing electrode 408.

The obtained element was subjected to the measurement of a short circuit current density and a photoelectric conversion efficiency using a solar simulator (AM1.5, 100 mW/cm$^2$, surface temperature of 25° C.). Also the element was subjected to the measurement of deterioration rate of the photoelectric conversion efficiency by an HH test (standing for 1000 hours under a temperature of 85° C. and a relative humidity of 85%) as an acceleration test.

In the semiconductor forming apparatus and the transparent electrode forming apparatus of roll-to-roll type, there were 18 observed failures in the transportation (emergency stops caused by an aberration of the edge of the substrate by ±3 mm from a standard value) in the course of formation of a 100 m long film. The obtained results are shown in Table 5.

EXAMPLE 11

Figure 5:
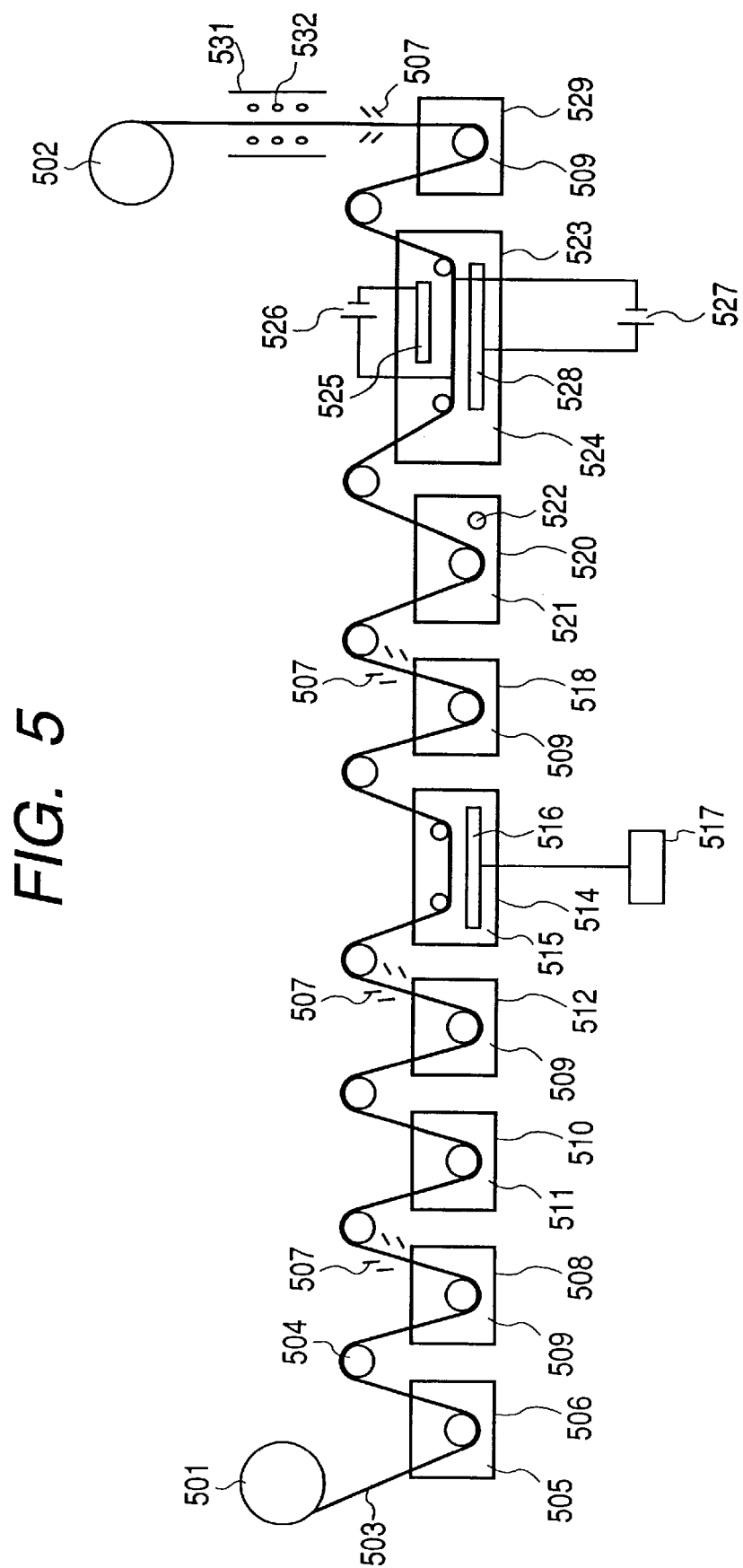

FIG. 5 shows an example of the present invention, utilizing a thin plate of stainless steel 430BA fed from the rolled thin plate as the substrate, wherein a feeding roller 501 feeds a long stainless steel substrate 503, which is finally wound up on a wind-up roller 502. Between the feeding roller 501 and the wind-up roller 503, there are provided, in succession, a degreasing tank 506, a water rinsing tank 508, an etching tank 510, a water rinsing tank 512, a metal layer forming tank 514, a water rinsing tank 518, a warm water tank 520, a zinc oxide layer forming tank 523, a water rinsing tank 529 and a drying oven 531. In each tank, there is provided a roller 504 for controlling the transporting path of the substrate 503. The process speed of the substrate 503 was maintained at 200 cm/min. The tension to the substrate 503 was maintained at 50 kgf and was controlled by a tension adjusting clutch not shown in the drawings incorporated in the wind-up roller 502.

The substrate 503 ant-rust treated with oil is at first subjected to oil removal in the degreasing tank 506. The degreasing bath 505 was composed of an aqueous solution containing 60 ml of sulfuric acid and 70 ml of hydrochloric acid (hydrogen chloride 37%, the same is applied hereinafter) in 1 liter of water. The bath 505 was maintained at room temperature. The substrate 503 was then transported through the roller 504 to the water rinsing tank 508 in which it was sufficiently rinsed with the rinsing bath 509 and the water rinsing shower 507. The amount of the water rinsing shower is preferably at least 2 liters per minute.

Then, the substrate 503 was transported through the roller 504 to the acidic etching tank 510. The etching bath was composed of a mixture of 3 parts of fluoric acid (hydrogen fluoride 46%, the same is applied thereinafter) and 1 part of acetic acid. The bath 511 was maintained at room temperature. The substrate was then transported to the water rinsing tank 512, similar to the water rinsing tank 508 after the degreasing bath. Since the next metal layer forming bath 515 is alkaline, the water of the water rinsing shower 517 in this step may be made weakly alkaline.

The substrate was then transported through the roller 504 to the metal layer forming tank 514, in which a metal layer was formed. The metal layer forming bath 515 contained 80 g of copper pyrophosphate, 300 g of potassium pyrophosphate, 6 ml of ammonia water (specific gravity 0.88) and 10 g of potassium nitrate in 1 liter of water. The bath 515 was maintained at a temperature of 50° to 60° C. and a pH of 8.2 to 8.8. The anode (counter electrode) 516 was composed of a copper plate and connected to the power source 517. In the present apparatus in which the substrate 503 was maintained at the ground potential, the layer formation was controlled by reading the current at the anode 516 of a copper plate. In the present example, the current density was maintained at 3 A/dm$^2$. The layer forming rate was 60 Å/sec, and the thickness of the metal layer formed in the metal layer forming bath was 4000 Å.

After rinsing in the rinsing tank 518 similar to the rinsing tank 508, the substrate 503 was transported through the roller 504 to the warm water tank 520 containing deionized water heated to 80° C. with the heater 522, and further transported through the roller 504 to the zinc oxide film forming tank 523. The zinc oxide forming bath 524 contained 60 g of zinc nitrate hexahydrate and 0.1 g of dextrin in 1 liter of water, and agitated with air. The bath was maintained at a temperature of 85° C. and a pH of 4.0 to 6.4. In the bath 524, there were provided a 120 mm-wide and 150 mm-long zinc plate having a buff-polished surface as a counter electrode 528 and a 130 mm-wide and 40 mm-long stainless plate 304 as a film deposition-preventing electrode 525 for preventing film deposition on the back surface of the substrate. The electrodeposition was conducted by grounding the substrate 503 (width of 120 mm and length of 3000 mm in the bath) constituting the negative electrode, supplying a current of 5.0 mA/cm$^2$ (0.5 A/dm$^2$: 9000 mA) between the positive counter electrode 528 and the negative electrode 503 from the power source 527 and also supplying a current of −0.8 mA/cm$^2$ (−0.08 A/cm$^2$: −41.6 mA) between the negative electrode 503 and the film deposition-preventing electrode 525 (the distance between the electrodes 503 and 525 being 35 mm) from the power source 526 so as to maintain the film deposition-preventing electrode 525 at a more negative potential.

The film forming rate was 50 Å/sec, and a thin zinc oxide film of a thickness of 1.5 μm was formed on the surface of the substrate facing the counter electrode without deposition of a zinc oxide film on the back surface of the substrate 503.

After rinsing in the rinsing tank 529 similar to the rinsing tank 508, the substrate 503 was transported through the roller 504 to the drying oven 531, which is provided with a warm air nozzle and an infrared heater 532 not shown in the drawings and in which warm air also effects water removal. The warm air from the nozzle was maintained at 80° C., and the infrared heater was maintained at 200° C.

The substrate 503 after the drying step was wound up on the wind-up roller 502 as a substrate 101 having thereon a metal layer 102 and a zinc oxide layer 103 (see FIG. 1).

The metal layer forming tank 514 and the zinc oxide layer forming tank 523 were agitated with air and were constantly monitored for pH and conductivity of the baths by pH meters capable of conducting temperature compensation by a glass electrode. The bath pH was controlled by the addition of ammonia to the metal layer forming tank 514 or by the addition of nitric acid to the zinc oxide film forming tank 523.

On the substrate 503 subjected to the formation of the metal layer and the thin zinc oxide film as explained in the foregoing, a semiconductor layer having a three-layered structure was formed using a roll-to-roll CVD apparatus. At first, an n-type semiconductor layer was formed by employing a gaseous mixture of silane, phosphine and hydrogen, heating the metal layer and the zinc oxide layer formed on the substrate 503 to a temperature of 340° C. and supplying an RF power of 400 W. Then, an i-type semiconductor layer was formed by employing a gaseous mixture of silane, germane and hydrogen, heating the substrate to 450° C. and supplying a microwave power, and a p-type semiconductor layer was formed by heating the substrate to 250° C. and employing a gaseous mixture of boron trifluoride, silane and hydrogen, thereby obtaining a bottom pin layer. Subsequently, a middle pin layer was similar formed by increasing the mixing ratio of silane and germane in the i-type layer, and a top pin layer was formed by depositing the i-type layer with silane and hydrogen. Then, ITO was deposited as the transparent conductive layer in a roll-to-roll sputtering apparatus. Thereafter, a current collecting electrode was prepared with a silver paste to obtain a photovoltaic element of a configuration shown in FIG. 1.

The obtained element was subjected to the measurement of a short circuit current density and a photoelectric conversion efficiency using a solar simulator (AM1.5, 100 mW/cm$^2$, surface temperature of 25° C.). Also the element was subjected to the measurement of deterioration rate of the photoelectric conversion efficiency by an HH test (standing for 1000 hours under a temperature of 85° C. and a relative humidity of 85%) as an acceleration test.

In the semiconductor forming apparatus and the transparent electrode forming apparatus of roll-to-roll type, no failure in transportation (emergency stop caused by an aberration of the edge of the substrate by ±3 mm from a standard value) was observed in the course of formation of a 100 m long film. The obtained results are shown in Table 7.

The following conclusions can be obtained from the results shown in Tables 5, 6 and 7. The thin zinc oxide film forming method of the present invention can prevent failure in substrate transportation in the roll-to-roll system and is sufficiently effective in improving the short circuit current, photoelectric conversion efficiency and reliability.

As explained in the foregoing, the present invention allows for the formation of a thin zinc oxide film by electrodeposition from an aqueous solution, while preventing film deposition on the back surface of the substrate. Such thin zinc oxide film forming technology is applied as the rear reflection layer to the solar cell production process thereby improving the short circuit current density, the photoelectric conversion efficiency, the production yield and the durability of the solar cell. Also it can contribute to the real spread of the solar power generation since the material cost and the running cost are significantly superior (i.e., about $\frac{1}{100}$) in comparison with those produced by sputtering or evaporation.

TABLE 1

| Current between | Example 1 | | | | Example 2 | | | | Example 3 | | | | Comparative Example 1 |
|---|---|---|---|---|---|---|---|---|---|---|---|---|---|
| electrodes 214 and 203 (mA/cm$^2$) | −0.1 (mA/cm$^2$) | −0.5 (mA/cm$^2$) | −1.0 (mA/cm$^2$) | −3.0 (mA/cm$^2$) | −0.1 (mA/cm$^2$) | −0.5 (mA/cm$^2$) | −1.0 (mA/cm$^2$) | −3.0 (mA/cm$^2$) | 0.1 (mA/cm$^2$) | 0.5 (mA/cm$^2$) | 1.0 (mA/cm$^2$) | 3.0 (mA/cm$^2$) | None |
| Film thickness (Å) Front | 12300 | 12000 | 11900 | 7300 | 4400 | 3950 | 3800 | 1000 | 8000 | 7700 | 7900 | 5500 | 12500 |
| Film thickness (Å) Center | 12010 | 12050 | 11980 | 11900 | 4000 | 4030 | 3850 | 3600 | 8000 | 7800 | 8030 | 7500 | 12100 |
| Film thickness (Å) Rear | 12500 | 11950 | 12050 | 8000 | 3900 | 4000 | 3900 | 1550 | 8130 | 8010 | 8010 | 3200 | 12000 |
| Film deposition on back surface | Δ | Δ | ○ | ○ | Δ | ○ | ○ | ○ | Δ | Δ | ○ | ○ | × |

×: Film deposition amount on the back surface of the substrate almost equal to that of Comparative Example 1
Δ: Film deposition amount on the back surface of the substrate smaller than that of Comparative Example 1
○: No film deposition on the back surface of the substrate

TABLE 2

| | Example 4 | Example 5 | Example 6 | Example 7 |
|---|---|---|---|---|
| Number of abnormal growth (visual observation) | 500 | 0 | 0 | 0 |
| Number of abnormal growth (SEM) | 1200 | 22 | 19 | 2 |
| 180° bending-peeling test | Peeling started at bended portion, and almost portions were peeled when bended portion retuerned to former state | No peeling but cracks of ca. 0.3 mm present | No peeling but cracks of ca. 0.4 mm present | No peeling and no crack |

TABLE 3

|  | Example 8 | Comparative Example 2 |
|---|---|---|
| Short circuit current (Relative value of Compar. Ex. 2) | 1.05 | 1 |
| Photoelectric conversion efficiency (Relative value to Compar. Ex. 2) | 1.21 | 1 |
| Deterioration rate of photoelectric conversion efficiency in HH test (%) | 10 | 43 |

TABLE 4

|  | Example 9 | Comparative Example 3 |
|---|---|---|
| Short circuit current (Relative value of Compar. Ex. 3) | 1.07 | 1 |
| Photoelectric conversion efficiency (Relative value to Compar. Ex. 3) | 1.28 | 1 |
| Deterioration rate of photoelectric conversion efficiency in HH test (%) | 3 | 28 |

TABLE 5

|  | Example 10 | Comparative Example 4 |
|---|---|---|
| Short circuit current (Relative value of Compar. Ex. 4) | 1.05 | 1 |
| Photoelectric conversion efficiency (Relative value to Compar. Ex. 4) | 1.25 | 1 |
| Deterioration rate of photoelectric conversion efficiency in HH test (%) | 4 | 30 |
| Transport failure (100 m) | 0 time | 18 times |

TABLE 6

|  | Example 10 | Example 9 |
|---|---|---|
| Short circuit current (Relative value of Compar. Ex. 9) | 1 | 1 |
| Photoelectric conversion efficiency (Relative value to Compar. Ex. 9) | 0.98 | 1 |
| Deterioration rate of photoelectric conversion efficiency in HH test (%) | 4 | 3 |

TABLE 7

|  | Example 11 | Example 9 |
|---|---|---|
| Short circuit current (Relative value of Compar. Ex. 9) | 0.99 | 1 |
| Photoelectric conversion efficiency (Relative value to Compar. Ex. 9) | 1 | 1 |
| Deterioration rate of photoelectric conversion efficiency in HH test (%) | 11 | 10 |

What is claimed is:

1. A method of forming a thin film of zinc oxide on a conductive substrate by supplying a current between the conductive substrate immersed in one or more aqueous solutions containing at least zinc ions and a counter electrode immersed in at least one of the aqueous solutions, which comprises:

immersing one or more film deposition-preventing electrodes for preventing film deposition on a back surface of the substrate, in at least one of the aqueous solutions; and supplying a current in such a manner that potentials of the film deposition-preventing electrode, the conductive substrate and the counter electrode satisfy a relationship of the counter electrode>the conductive substrate>the film deposition-preventing electrode or the counter electrode<the conductive substrate<the film deposition-preventing electrode.

2. A method of forming a thin film of zinc oxide according to claim 1, wherein 0.1% to 100% of a current applied between the conductive substrate and the film deposition-preventing electrode does not exceed an absolute value of the current applied between the counter electrode and the conductive substrate.

3. A method of forming a thin film of zinc oxide according to claim 1, wherein the aqueous solution contains nitrate ions and sucrose or dextrin.

4. A method of forming a thin film of zinc oxide according to claim 1, wherein a conductive substrate having a deposited thin film of zinc oxide previously formed thereon is used as the conductive substrate.

5. A method of forming a thin film of zinc oxide according to claim 1, wherein the thin film of zinc oxide is formed continuously in a roll-to-roll system.

6. A method of forming a thin film of zinc oxide according to claim 5, wherein the film deposition-preventing electrode is provided so as to oppose a conductive substrate wind-up side portion of the counter electrode or to both oppose a conductive substrate wind-up side portion of the counter electrode and be positioned closer to a conductive substrate wind-up side than the counter electrode.

7. A method of forming a thin film of zinc oxide according to claim 1, wherein the film deposition-preventing electrode and the counter electrode are provided in a same aqueous solution.

8. A method of forming a thin film of zinc oxide according to claim 1, wherein an area of a portion of the film deposition-preventing electrode opposing the conductive substrate does not exceed 50% of an area of the conductive substrate present in a thin zinc oxide film-forming bath.

9. A method of forming a thin film of zinc oxide according to claim 5, wherein a width of the film deposition-preventing electrode does not exceed 120% of a width of the conductive substrate.

10. A method of forming a thin film of zinc oxide according to claim 1, wherein a distance between the film deposition-preventing electrode and the conductive substrate is within a range from 10 mm to 1000 mm.

11. A method of forming a thin film of zinc oxide according to claim 5, wherein a length of the film deposition-preventing electrode does not exceed 100% of a width of the conductive substrate.

12. A method of forming a semiconductor element substrate, which comprises a step of forming a thin film of zinc oxide by utilizing a method of any one of claims 1 to 11.

13. A method of producing a photovoltaic element, which comprises a step of forming a semiconductor layer on a semiconductor element substrate formed by a method of claim 12.

* * * * *

UNITED STATES PATENT AND TRADEMARK OFFICE
CERTIFICATE OF CORRECTION

PATENT NO. : 6,133,061
DATED : October 17, 2000
INVENTOR(S) : Yuichi Sonoda

It is certified that error appears in the above-identified patent and that said Letters Patent is hereby corrected as shown below:

Column 3,
Line 22, "is" should read -- be --; and
Line 28, "contain" should read -- contains --.

Column 9,
Line 57, "a" should read -- an --.

Column 12,
Line 48, "to" should be deleted.

Column 13,
Line 65, "ant-rust" should read -- anti-rust --; and
Line 67, "solution-" should read -- solution --.

Column 15,
Line 48, "similar" should read -- similarly --.

Column 16,
Line 17, "process" should read -- process, --;
Table 1,

| " | Example 1 | | | | Example 2 | | | | Example 3 | | | " |
|---|---|---|---|---|---|---|---|---|---|---|---|---|
| | -0.1 | -0.5 | -1.0 | -3.0 | -0.1 | -0.5 | -1.0 | -3.0 | 0.1 | 0.5 | 1.0 | 3.0 | should read

| " | Example 1 | | | | Example 2 | | | | Example 3 | | | " |
|---|---|---|---|---|---|---|---|---|---|---|---|---|
| -- | -0.1 | -0.5 | -1.0 | -3.0 | -0.1 | -0.5 | -1.0 | -3.0 | 0.1 | 0.5 | 1.0 | 3.0 -- |

Table 2, "growth" (both occurrences) should read -- growths --, "almost portions were" should read -- portions were almost --, and "returened" should read -- returned --.

UNITED STATES PATENT AND TRADEMARK OFFICE
CERTIFICATE OF CORRECTION

PATENT NO. : 6,133,061
DATED : October 17, 2000
INVENTOR(S) : Yuichi Sonoda

It is certified that error appears in the above-identified patent and that said Letters Patent is hereby corrected as shown below:

Column 18,
Line 51, "electrode" should read -- electrode or to be positioned closer to a conductive substrate wind-up side than the counter electode --.

Signed and Sealed this

Eighteenth Day of December, 2001

Attest:

JAMES E. ROGAN
*Attesting Officer*     *Director of the United States Patent and Trademark Office*